United States Patent [19]
Crafts

[11] Patent Number: 6,005,824
[45] Date of Patent: Dec. 21, 1999

[54] INHERENTLY COMPENSATED CLOCKING CIRCUIT FOR DYNAMIC RANDOM ACCESS MEMORY

[75] Inventor: Harold S. Crafts, Colorado Springs, Colo.

[73] Assignee: LSI Logic Corporation, Milpitas, Calif.

[21] Appl. No.: 09/106,965

[22] Filed: Jun. 30, 1998

[51] Int. Cl.⁶ ..................................................... G11C 8/00
[52] U.S. Cl. ........................... 365/233; 365/194; 365/211
[58] Field of Search ................................. 365/294, 200, 365/230.06, 233, 211, 212, 236

[56] References Cited

U.S. PATENT DOCUMENTS

| | | | |
|---|---|---|---|
| 4,866,676 | 9/1989 | Crisp et al. | 365/200 |
| 5,208,778 | 5/1993 | Kumanoya et al. | 365/201 |
| 5,231,319 | 7/1993 | Crafts et al. | 307/603 |
| 5,270,977 | 12/1993 | Iwamoto et al. | 365/201 |
| 5,323,348 | 6/1994 | Mori et al. | 365/200 |
| 5,325,334 | 6/1994 | Roh et al. | 365/201 |
| 5,373,472 | 12/1994 | Ohsawa | 365/201 |
| 5,375,095 | 12/1994 | Yamada et al. | 365/230.03 |
| 5,386,386 | 1/1995 | Ogihara | 365/200 |
| 5,388,104 | 2/1995 | Shirotori | 371/21.1 |
| 5,440,517 | 8/1995 | Morgan et al. | 365/202 |
| 5,471,482 | 11/1995 | Byers et al. | 371/21.2 |
| 5,499,214 | 3/1996 | Mori et al. | 365/211 |
| 5,502,675 | 3/1996 | Kohno et al. | 365/200 |
| 5,517,450 | 5/1996 | Ohsawa et al. | 365/200 |
| 5,577,004 | 11/1996 | Lesham | 365/230.03 |
| 5,619,463 | 4/1997 | Malhi | 365/233 |
| 5,623,640 | 4/1997 | Nakabo | 395/497.01 |
| 5,650,975 | 7/1997 | Hamade et al. | 365/230.01 |
| 5,668,755 | 9/1997 | Hidaka | 365/182 |
| 5,684,751 | 11/1997 | Manning | 365/233 |
| 5,689,466 | 11/1997 | Quereshi | 365/201 |
| 5,694,355 | 12/1997 | Skjaveland et al. | 365/149 |
| 5,825,682 | 10/1998 | Fukui | 365/49 |

OTHER PUBLICATIONS

"Automatic Small Computer System Interface Termination Circuit for Narrow/Wide Devices on Wide Bus", IBM Technical Disclosure Bulletin, vol. 40, No. 4, Apr. 1997, New York, US, pp. 79–82.

"BI–0316 Mass Storage Module", Dec. 6, 1996, Brand Innovators B.V. XP002071927. Available from Internet<URL:http/www.brandinnovators.com/manual/bi0316/book_33.htm>.

*Primary Examiner*—Tan T. Nguyen

[57] ABSTRACT

A clock delay circuit which creates control signals relative to a clock signal which vary in relation to inherent variables arising from manufacturing process, temperature and voltage influences on a memory array. The clock delay circuit preferably comprises a pair of spare word lines and a pair of spare bit lines of the memory, each of which extends across the memory array. Signals conducted along the spare word and bit line create a signal which is supplied to a counter and decoder to supply a plurality of control signals having a timing relationship established relative to the clock. The spare word line and spare bit line comprise electrical characteristics affecting signal propagation time similar to a signal propagation time along one of an actual word line or actual bit line, respectively.

19 Claims, 6 Drawing Sheets

INHERENTLY COMPENSATED CLOCKING CIRCUIT FOR DYNAMIC RANDOM ACCESS MEMORY

CROSS-REFERENCE TO RELATED APPLICATION

This invention is related to the following inventions which are described in U.S. patent applications titled "Electrically Selectable Redundant Components for an Embedded DRAM," Ser. No. 08/997,503, filed on Dec. 27, 1997, "DRAM With Built-In Noise Protection," Ser. No. 09/050, 674, filed Mar. 30, 1998, "Embedded DRAM with Noise-Protected Differential Capacitor Memory Cells," Ser. No. 09/052,279, filed Mar. 30, 1998, and "Hierarchical, Adaptable-Configuration Dynamic Random Access Memory," Serial No. (Docket 98-036), filed currently herewith. The inventions of these applications were made by the inventor herein and are assigned to the assignee hereof. The disclosures of these applications are incorporated in this application by this reference.

This invention generally relates to dynamic random access memory (DRAM). More particularly, the present invention relates to new and improved clocking circuit used for controlling the timing of various functions associated with DRAM by compensating for operating variables associated with temperature, voltage and process.

BACKGROUND OF THE INVENTION

A DRAM is a memory element which typically holds and supplies information in a microprocessor based computer system. The microprocessor based system may be a general purpose computer system or may be an application-specific integrated circuit (ASIC) or a system-level integrated circuit (SLIC) which is fabricated to perform a specific function. The system uses a system clock which provides pulses at a predetermined rate. The system clock pulses coordinate many system functions and operations, including generally synchronizing the timing of the DRAM operations with those of the microprocessor. The DRAM delivers information to, and receives information from the microprocessor, via electrical conductors over a system bus. The information stored in the DRAM is used by the microprocessor for computation and control of other peripheral components typically associated with the microprocessor-based system.

The typical DRAM comprises a plurality of DRAM segments and control logic for controlling the DRAM segments. The typical DRAM segment is formed by thousands of individual memory cells arranged in a matrix-like configuration. Each DRAM cell includes a capacitor which is electrically charged in a "write" operation. The electrical charge establishes a voltage on the capacitor, and the level of the voltage represents data. A higher voltage level represents a "1" data bit, while a lower voltage level represents a "0" data bit, or vice versa. The voltage level on the capacitor is sensed during a "read" operation.

The cells of the matrix are addressed by signals supplied on a word line and signals read from selected bit lines or written on selected bit lines. The word lines extend along horizontal rows of cells and intersect vertical columns of cells in the matrix. The bit lines extend along vertical columns of cells and intersect horizontal rows of cells in the matrix. In concept, by energizing a selected word line and reading or writing only on selected bit lines, individual cells at the intersections of the selected word and bit lines are written or read. In this manner, unique memory "addresses" represent specific word line and bit line combinations which access the information located at the cells identified by the address. Memory cell addresses are used by the microprocessor in organizing memory information.

The control logic interacts with the microprocessor and effectively performs the read and write operations on the DRAM memory cells. The control logic receives control signals from the microprocessor requesting a read or write operation, and address signals indicating the memory cell addresses where the read or write operation is to be performed. The control logic then produces the necessary control and address signals to carry out the read or write operation on the addressed memory cells. For a write operation, the microprocessor also provides the data to be stored in the addressed memory cells. For a read operation the data obtained from the addressed DRAM cells is supplied to the microprocessor.

In order for the DRAM control logic to use the information supplied by the microprocessor, which may only be available for a short period of time, the control logic temporarily stores the information in temporary "input" registers. The DRAM control logic recognizes when the information is available and produces a "latch control signal" that secures or "latches" the information into the temporary registers. Thus, the latch control signal produced by the DRAM control logic stores the information located on the address and data buses into the temporary DRAM registers.

Ideally, the DRAM control logic should latch the information into the temporary registers with the same system clock pulse used by the microprocessor to place the data and address information on the system bus. However, the signals on the system bus must propagate through the microprocessor logic and along the system bus until they appear at the DRAM. Because of signal propagation effects, the information on the bus usually is not stabilized until after the system clock pulse has passed. Therefore the DRAM control logic cannot use the same system clock pulse and must create a delayed latch control signal to store or latch the information into the registers once the information has stabilized.

Consequently, the DRAM control logic must generate a number of DRAM control signals internally, independently of the system clock but not synchronized with the system clock pulses. However the DRAM control signals must occur within predetermined time limits set by the system clock, in order to interface and coordinate with the system operation in a time-efficient manner. The timing characteristics of the DRAM control signals are dependent on the characteristics of the DRAM which may vary from one DRAM to another or may vary according to the different types of SLICs into which the DRAM is integrated.

Delay circuits are typically used in the DRAM control logic to create the latch control signal. Otherwise, the DRAM control logic would be forced to use the next system clock pulse as a control signal to store the microprocessor-created information into the temporary registers. Waiting for another system clock pulse significantly slows the speed of the memory, slows the performance of the system microprocessor, and is thus undesirable.

After storing the information in the temporary registers using the DRAM latch control signal, the DRAM control logic uses the stored information to read or write the memory cells during the next system clock cycle. To read memory cells, a segment enable control signal is delivered to a segment of the DRAM array containing the particular cells. Additionally, address signals indicating the particular word and bit lines to be activated are also delivered to the DRAM segment. The energized word line signal causes a transistor in the memory cells of that row to become conductive. With the transistors in a conductive state, the voltages existing on the memory cell capacitors are placed on the bit lines associated with that DRAM segment. Control signals are conducted to enable sense amps of the selected bit lines and sense the voltage on the bit line connected to the particular memory cell and complete the read process.

The sense amps compare a bit line voltage to a threshold voltage and determine whether the bit line voltage is higher or lower than the threshold voltage. If the voltage is higher than the threshold voltage, then the information stored in the memory cell represents a 1 data bit. Similarly, if the voltage is lower than the threshold voltage then the information stored in the memory cell represents a 0 data bit. The opposite relationship may also be employed to establish 1 data bits and 0 data bits. Alternatively, two capacitors may be used to store relatively different charges to represent the data bits. Instead of comparing the charge of one capacitor to a threshold voltage, the two stored charges are compared to each other. Comparing the relative voltage relationship yields the 1 and 0 data bit information stored in the memory cell. The two differential capacitor DRAM memory cell structure is discussed more completely in co-pending application titled "Embedded DRAM with Noise-Protected Differential Capacitor Memory Cells," Ser. No. 09/052,279, which was filed on Mar. 30, 1998.

Generally, to accomplish sensing, the DRAM control logic delivers a sense amp enable control signal to the sense amps which persists while the sense amps are operative. The DRAM control logic negates the sense amp enable control signal when no sensing is required.

Once the sense amps have produced data bit signals based on the memory cell signals, the data is stored in a temporary "output" register in the DRAM control logic until the microprocessor is ready to accept the data, usually in the next system clock cycle after the data is available. The DRAM control logic produces a latch control signal to store the data in the temporary "output" registers in a similar manner to the creation of the latch control signal to store incoming data in the "input" temporary registers.

Additionally, the DRAM control logic produces an output enable control signal to enable the delivery of the signals from the output registers. The output enable control signal is conducted to the microprocessor after the signals from the output registers have been placed on the system data bus. Once the microprocessor receives the output enable signal, it recognizes that the data is present on the system data bus and is available to be used by the microprocessor.

Besides the control signals for the read and write operations, the DRAM control logic also produces control signals to perform other typical DRAM operations, e.g., "memory segment enable," "precharge" and "refresh." The memory segment enable operation involves the conduction of a control signal to the proper memory segment to activate that segment for either a read or write operation.

The precharge operation typically occurs before any voltages from the memory cells are applied to the bit lines. During the precharge operation, a voltage is applied to all the bit lines to charge each bit line to a point approximately midway between an expected high voltage and an expected low voltage from the memory cell capacitors. During a subsequent read or write operation, the charge on the capacitor modifies the charge on the bit line. Since the bit line has been partially charged to the midpoint between the high and low values, the time it takes for the connected memory cell capacitor to bring the bit line charge to the level of the memory cell capacitor is reduced, thus increasing the performance of the DRAM. Moreover, the time it takes to modify the charge on the precharged bit line is substantially less than the worst-case time for charging a non-precharged bit line to a high voltage level. Therefore, during a read operation the sense amps can effectively begin sensing the bit lines sooner, and during a write operation, the time allotted to charging the memory cell capacitor is reduced. Additionally, since the precharge operation can take place simultaneously with other internal operations, for example during decoding of the memory address, the overall read or write operation time is reduced.

The control logic also produces refresh control signals to refresh the charge on the memory cell capacitors since the charges are not "permanent" and dissipate after a relatively short period of time, typically on the order of a few milliseconds. Thus the DRAM control logic conducts a refresh operation which recharges the memory cell capacitors and maintains the integrity of the stored information. The refresh process typically involves reading the information stored in the memory cells, temporarily storing the information in registers, and then writing the information back into the memory cells. Read operations are destructive because they diminish the stored charge on the memory cell and for this reason, a "write-back" operation is typically performed to recharge the read memory cell. The DRAM control logic continuously refreshes the memory by performing read-write back operations on different portions of memory, before the charges have dissipated and data is lost on any portion. No data signals are required to perform the read-write back operations, since the data signals read are the same ones written back, so the DRAM control logic can perform the refresh operation autonomously. The DRAM control logic is programmed to refresh separate portions of memory during each system clock cycle. The order in which memory cells are refreshed is not overly important, as long as each memory cell is refreshed before the memory cell charge has decreased below necessary threshold levels and the data is lost. Typical DRAM memory cells require refreshing every one or two milliseconds, and the DRAM control logic assures that all the memory cells in the segment are refreshed within this time frame.

The control signals delivered by the DRAM logic are usually voltage pulses or "strobes," which remain asserted for the duration of the operation. When a control signal strobe decreases to a relatively lower level, the operation initiated by the control signal terminates. Other DRAM logic control signals may be active at a low voltage level, and a high voltage is consequently present during periods of non-operation. In either case, it is important that the strobes remain asserted until the operation has had sufficient time to complete its task, otherwise improper data storage or recovery or unreliable operation of the DRAM may result.

During the precharge operation, for example, the predetermined time period must be sufficiently long to allow all the bit lines to completely precharge to the midpoint level. The typical minimum or shortest time period for a precharge operation is defined by the time it takes for a signal to propagate along the length of a bit line with the greatest propagation time. Usually, the bit line with the highest resistance or greatest length or both has the greatest propagation time, and it determines the minimum precharge time period for a given memory segment. The DRAM control Logic should assert the precharge control signal for a time period which is equal to the minimum precharge time period. Otherwise, the DRAM control logic may assert the precharge control signal for a time period which is too short, causing premature termination of the precharge operation and resulting in inadequately precharged bit lines. Alternatively, the DRAM control logic may assert the precharge control signal for a time period which is too long and therefore waste time which might be used to perform other memory functions, thereby diminishing the performance of the memory.

The minimum time periods associated with satisfactory completion of the read, write and refresh operations are also dependent upon the time it takes for signals to propagate along the word and bit lines. The speed of the memory can be enhanced by consuming no more than the minimum signal propagation time for the read, write and refresh operations. The actual signal propagation times for each bit and word line depend on the characteristics of the bit or word line conductors, and these characteristics vary somewhat in different chips based on the manufacturing process.

The complex manufacturing process typically causes unforseen and usually uncontrollable slight variations from chips in different manufacturing lots, often resulting in propagation time variations.

Additionally, the minimum operating temperature of the chip also influences the time required to complete the DRAM operations. Typically, the operating temperature of the bit and word line conductors fluctuates during operation because of current conduction and other environmental conditions. As the temperature increases in the semiconductors, the resistance increases and the current conduction generally decreases. As current conduction changes, signal propagation times also change. Thus, for a given voltage, operating temperatures influence the minimum time required for satisfactory completion of each operation and the optimal propagation times.

Similarly, the operating voltages applied to the word and bit lines may vary during the operation of the DRAM module and these fluctuations also affect the required minimum time periods for each DRAM operation. The primary cause of the voltage variations is due to component variations in the power supply. When the voltages applied to the bit or word lines increase, current conduction generally increases which causes signal propagation time to decrease. However, when the applied voltage decreases, the current conduction also decreases which slows signal propagation and increases the minimum time periods for each operation.

The typical approach to accounting for these process, temperature and voltage variations is to assert the DRAM control signals for time periods sufficient to accommodate worst case conditions. However, worst case timing is usually longer than necessary, and time is wasted during normal operations in accounting for worst case occasions. The performance or speed of the DRAM is slowed, or the system performance is reduced because more system clock cycles will be required to accomplish the DRAM operations.

A partial solution to these worst case variables involves a determination of the propagation times. A redundant word line is inserted in the DRAM segment, and a signal is propagated through the redundant word line at the beginning of a given memory operation. The propagation of the signal is timed by the DRAM control logic, and the additional time required for propagation is added to the minimum time periods for each operation. Once accounted for in this manner, the control signals remain asserted for a time period based on a best-case minimum time period combined with the calculated delay.

Although the additional redundant word line provides some compensation for variations in propagation times, the compensation calculation itself requires additional time and although better than worst case conditions, still may not be optimum. Furthermore, the redundant word line compensation technique will not quickly provide control timing information for all the control signals supplied by the DRAM control logic.

It is with respect to these and other considerations relating to creating DRAM logic circuits that the present invention has evolved.

SUMMARY OF THE INVENTION

The present invention achieves improved timing for DRAM logic control signals to accommodate for variations in signal propagation times caused by process, temperature and voltage variables which influence the DRAM. In addition, the present invention inherently accommodates for the influences caused by process, temperature and voltage on a continuous basis during operation of the DRAM control logic. Moreover, as a result of the continuous timing compensation, the DRAM control logic signals are optimized for the process, temperature and voltage variables so as to avoid restricting the performance and speed of operation of the microprocessor and system operation in a SLIC. Further still, the present invention advantageously uses spare word and bit lines in a clock delay circuit of the DRAM control logic to compensate for the process, voltage and temperature variations and thereby obtain optimum timing.

In accordance with these and other improvements, the present invention comprises a clock delay circuit for creating control signals that have timing relationships relative to a clock signal which vary in relation to inherent variables arising from manufacturing process, temperature and voltage influences on the memory. The memory clock delay circuit comprises an oscillator having a feedback delay element which establishes an oscillation frequency and period for an output oscillation signal. The feedback delay element preferably includes a pair of spare word lines and a pair of spare bit lines each of which extends across the memory array. The clock delay circuit also comprises a counter and decoder circuit which is responsive to the output oscillation signal and supplies a plurality of control signals having a timing relationship established relative to the clock signal by the period of the oscillation signal.

In accordance with preferred aspects of the present invention, the clock delay circuit supplies only one control signals at a time on a separate output conductors to create various control signals such as read or write enable signals, a sense amplifier enable signal, latch data enable signal, and an output enable signal or to negate control signals such as a precharge control signal, the sense amplifier enable signal or the latch data enable signal.

The pulse time period of each of the control signals is established by the period of oscillation of the output oscillation signal and is preferably one half of the period of the output oscillation signal.

With respect to other preferred aspects of the present invention, the spare word line and spare bit line of the clock delay circuit comprise electrical characteristics affecting signal propagation time similar to a signal propagation time along one of an actual word line or actual bit line, respectively. The electrical characteristics caused in part by connecting the spare word line and spare bit line to inactive memory cells and extending the spare word and bit lines along rows and columns of a memory segment.

In accordance with yet other preferred aspects of the present invention the clock delay circuit comprises a reset circuit which enables the oscillator and receives a reset signal from the counter and decoder circuit to terminate the enable signal in response to the last control signal supplied.

A more complete appreciation of the present invention and its scope can be obtained by reference to the accompanying drawings, which are briefly summarized below, by reference to the following detailed description of a presently preferred embodiment of the invention, and by reference to the appended claims.

DETAILED DESCRIPTION

Figure 1:
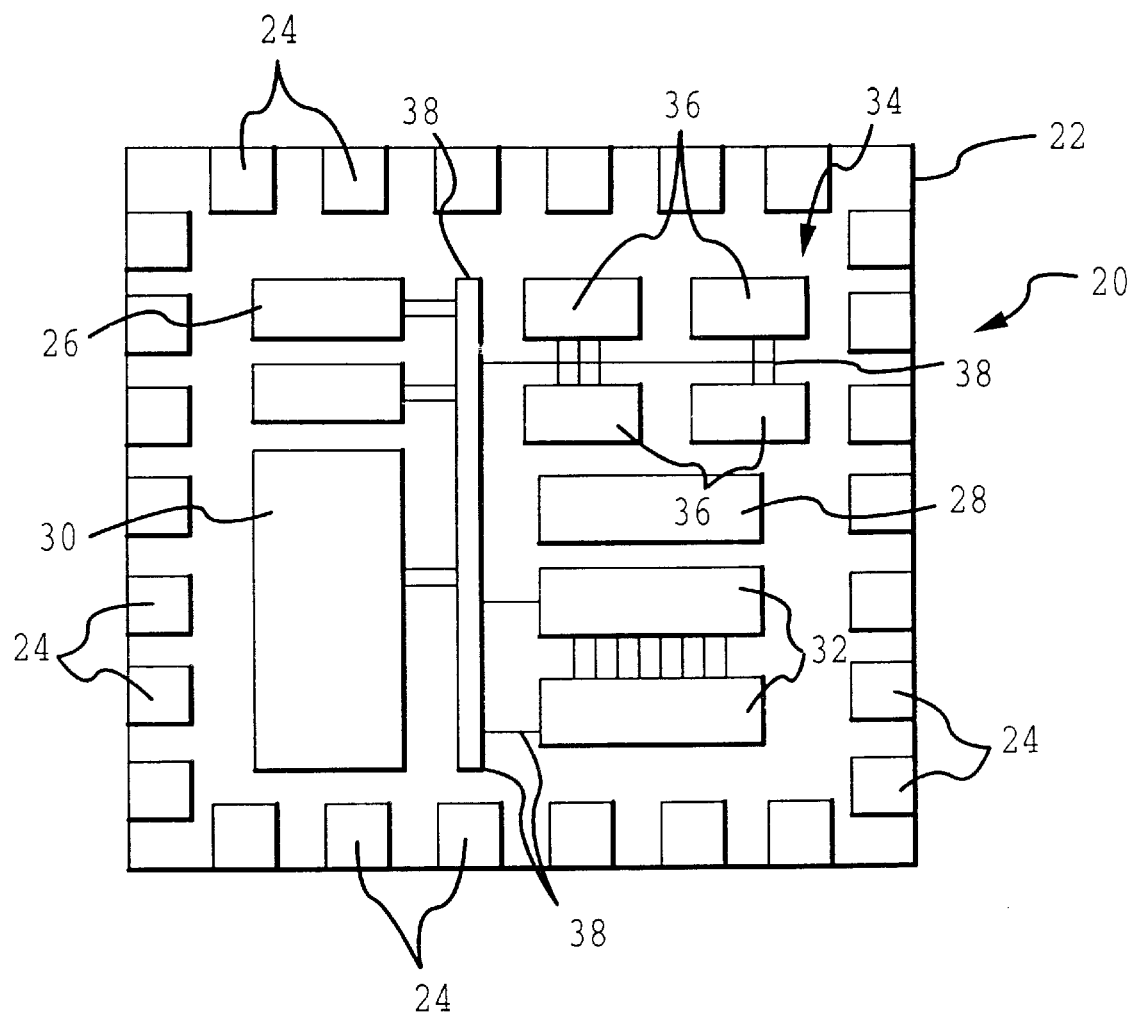
FIG. 1 is an overall layout illustration, not necessarily to scale or in proportion, illustrating a typical SLIC with an embedded DRAM array incorporating the present invention.

A system level integrated circuit (SLIC) 20 which incorporates the present invention is generally shown in illustrative, not-to-scale and not-to-proportion form in FIG. 1. Other than the present invention, the SLIC 20 is conventional. The SLIC 20 is formed as an integral unit on a die or chip 22. Pads 24 are formed on the exterior of the chip 22 by which to connect external electrical conductors (not shown), once the chip 22 has been packaged in a standard IC package (also not shown). The pads 24 are connected by internal conductors to the various functional components of the SLIC 20. The functional components of the SLIC 20 will vary according to the SLIC, but in general those components will include a processor 26, a read only memory (ROM) 28, logic arrays 30, and registers 32, for example, as well as other well known digital and/or analog components.

Included in the SLIC 20, or other IC, is an embedded dynamic random access memory (DRAM) array 34, which incorporates the present invention. The embedded DRAM array 34 is formed by a plurality of separate DRAM segments 36 which are interconnected by electrical conductors forming a system bus 38 on the chip 22. The system bus 38 also connects to many of the other components of the SLIC, including the processor 26. The system bus 38 is of the standard configuration having a plurality of separate conductors which are generally located parallel to one another and over Which system clock, control, address and data signals are transmitted between the various components 26, 28, 30, 32, and 34, etc. In general, the numbers, types and layouts or positions of the specific SLIC components on the chip 22 will vary according to each different SLIC.

Figure 2:
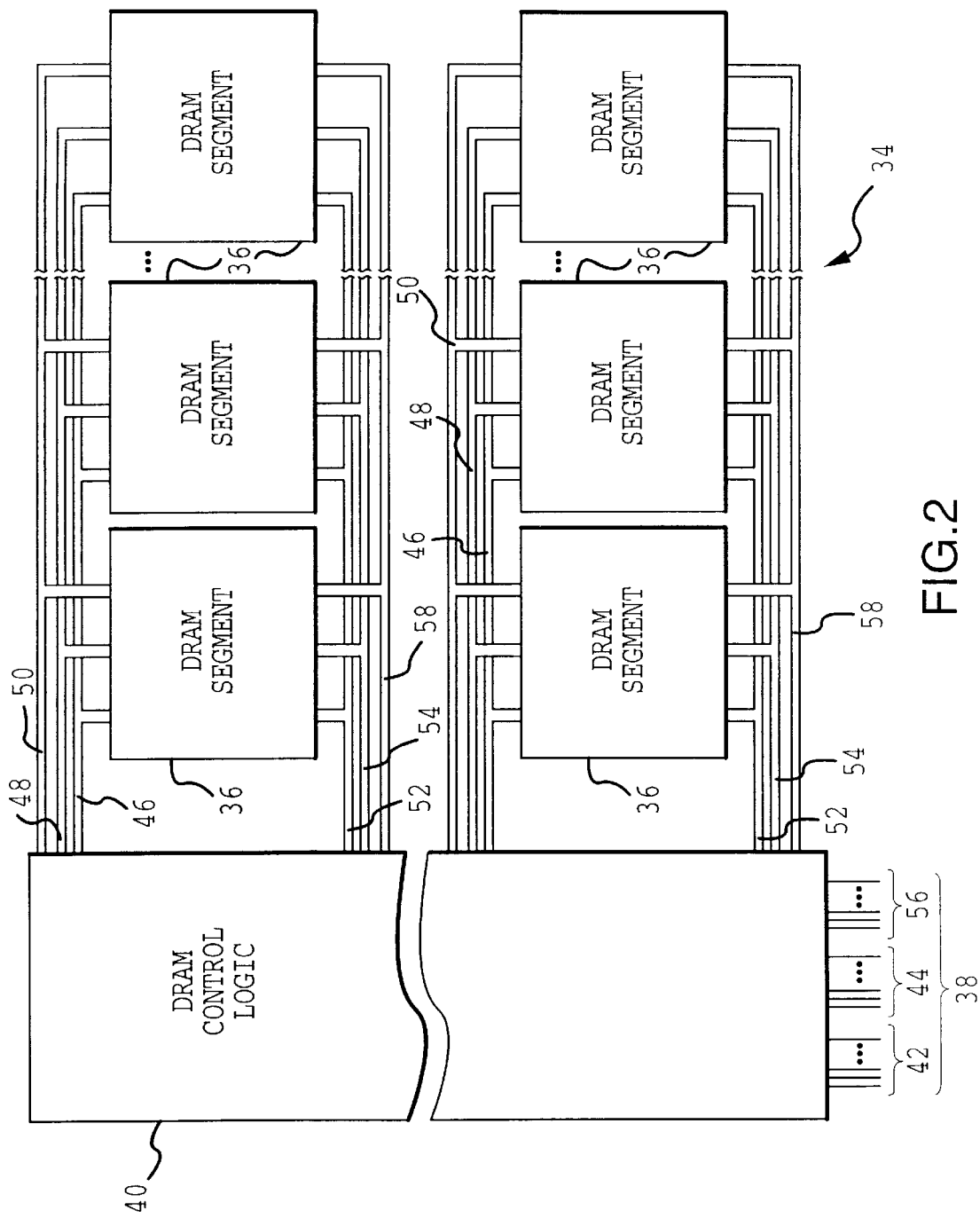
FIG. 2 is a block diagram of the DPAM array shown in FIG. 1, illustrating a plurality of DRAM segments.

More details of embedded DRAM array 34 are shown in FIG. 2. The amount of embedded DRAM in the array 34 is generally established by replicating the number of individual DRAM segments 36 until the desired size is achieved. For ease in SLIC fabrication, the DRAM segments 36 are designed as separate integral units of a specific memory size, for example, 64 kilobits arranged in 8-bit words. Although six separate DRAM segments 36 are shown in FIG. 2, it is not unreasonable to expect that some SLICs may require as many as 1–4 megabits of memory, thereby requiring at least 16–64 separate 64 kilobit DRAM segments 36 to be reproduced. Of course, the position or layout of those DRAM segments 36 will usually vary from one SLIC chip to another, because the layout of each different SLIC chip is different.

The DRAM segments 36 are connected to and interface with the bus 38 through DRAM control logic 40 as shown in FIG. 2. The DRAM control logic 40 includes the conventional devices typically used to maintain and sustain the operation of the DRAM array 34, such as data-in registers, data-out registers, address registers, refresh counters, data buffers and drivers (not shown in FIG. 2). The DRAM control logic 40 also includes elements which receive address signals conducted on conductors forming an address bus 42 of the system bus 38. The address bus signals at 42 are separated by the DRAM control logic 40 into segment address signals, which are applied on a segment address bus 46 of the DRAM array 34, into word address signals, which are applied on a segment word address bus 48 of the DRAM array 34, and into bit line address signals which are applied on a segment bit line address bus 50 of the DRAM array 34. In addition, the DRAM control logic 40 connects data bus conductors 44 of the system bus 38 to a segment data-in bus 52 of the DRAM array 34 and to a segment data-out bus 54 of the DRAM array 34. Another group of conductors form a control bus 56 of the system bus 38 which is connected by the DRAM control logic 40 to a segment control bus 58 of the DRAM array 34. Control signals are supplied by the processor 26 (FIG. 1) over the control bus conductors 56 of the system bus 38 to control the SLIC components, including the DRAM array 34. The DRAM control logic 40 distributes the control signals from the control bus 56 to the segment control bus 58. The signals on the segment address bus 46, the segment word address bus 48, the segment bit line address bus 50, the segment data-in bas 52, the segment data-out bus 54 and the segment control bus 58 are supplied to each DRAM segment 36 of the DRAM array 34.

Figure 3:
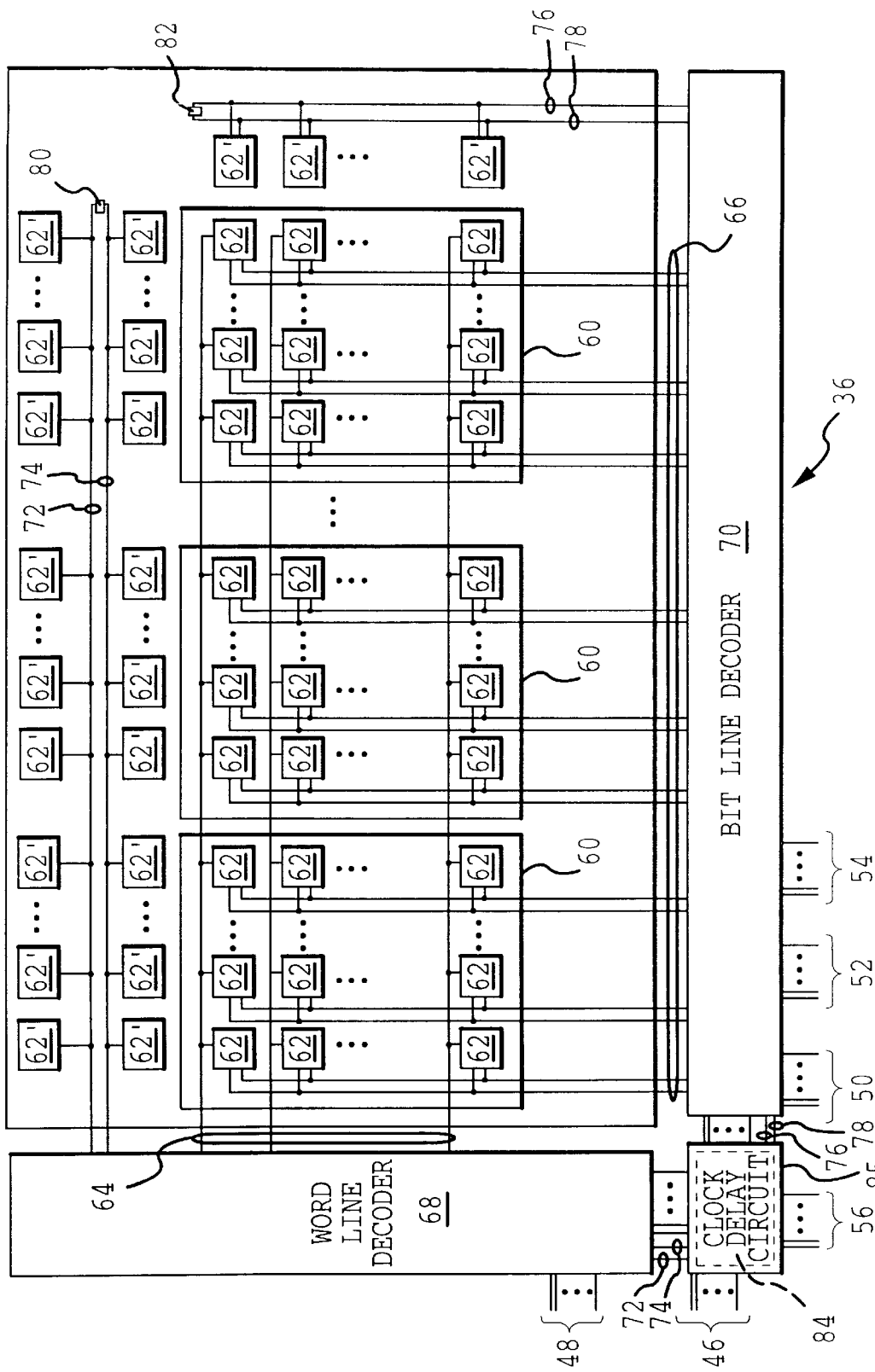
FIG. 3 is a block diagram of one of the DRAM segments shown in FIG. 2.

Each DRAM segment 36 is formed by a plurality of sub-parts referred to as bit blocks 60 and each bit block 60 is formed of memory cells 62 as shown in FIG. 3. The arrangement of the memory cells 62 into bit blocks 60 and the resulting operating characteristics of this arrangement is discussed more completely in the above-referenced U.S. application titled "Electrically Selectable Redundant Components For An Embedded DRAM," Ser. No. 08/997,503, which was filed on Dec. 27, 1997.

The DRAM cells 62 in the bit blocks 60 generally have the conventional construction of a matrix-like configuration arranged in horizontal rows and vertical columns. The individual DRAM cells 62 in specific rows within each bit block 60 of each DRAM segment 36 are interconnected in the conventional manner by word lines 64. The individual DRAM cells 62 in the vertical columns within each DRAM segment 36 are interconnected by bit line pairs 66 as disclosed in the above-referenced U.S. patent application titled "Embedded DRAM with Noise-Protected Differential Capacitor Memory Cells," Serial No. (Docket No. 98-097), which was filed on Mar. 30, 1998.

Conventional word line and bit line decoders 68 and 70 of each DRAM segment 36 are connected to the conductors of the segment address bus 46. The word line and bit line decoders 68 and 70 respond to predetermined address signals supplied on the segment address bus 46, the segment word address bus 48 and the segment bit line address bus 50, to energize or activate those specific word line conductors 64 and bit line conductors 66 which correspond to the address signals supplied at bus 42 (FIG. 2). The activated word and bit line conductors 64 and 66 access the memory cells of each of the bit blocks 60 of the DRAM segment 36 to read and write the selected information. Usually the information is read or written in words having predetermined bit widths, typically determined by the number of bit blocks 60 in each DRAM segment 36. The information which is read from the DRAM segments 36 is conducted over the segment data-out bus 54, and the information which is written to the DRAM segment 36 is applied to the segment data-in bus 52.

Each DRAM segment 36 also comprises spare word lines 72 and 74 and spare bit lines 76 and 78. The lines 72, 74, 76, and 78 are considered to be spares because they simulate actual word and bit lines in size and length and are connected to riot-active memory cells 62'. The not-active memory cells 62' load the spare word and bit lines to simulate the delay encountered by actual functioning memory cells 62.

The spare word line conductor 72 extends from the word line decoder 68 and extends through the DRAM segment 36, spanning the horizontal length of the segment 36 along the memory cells 62 of the bit blocks 60 and parallel to the other word line conductors 64 which connect to the active memory cells 62. The terminal end of the spare word line 72 attaches to an inverting buffer 80 which connects to the other terminal end of the spare word line 74. The spare word lines 72 and 74 are substantially parallel to each other and are substantially the same length.

Similarly, the spare bit line conductors 76 and 78 extend from the bit line decoder 70, spanning the vertical height of the DRAM segment 36. The spare bit line conductors 76 and 78 are substantially the same length and are positioned substantially parallel to each other. Also, the spare bit line conductors 76 and 78 are preferably serially connected by an inverting buffer 82 positioned at the terminal ends of the conductors 76 and 78 opposite of the bit line decoder 70.

From the standpoint of the microprocessor 26 (FIG. 1), the primary operations of the DRAM array 34 are the read and write operations. To begin either a read or write operation, the microprocessor 26 (FIG. 1) delivers control signals over the control conductors 56 (FIG. 2) of the system bus 38 to the DRAM control logic 40. The control signals at 56 include a system clock for timing and control operations and a read or write control signal dictating which operation is to be performed. The address information at 46, 48 and 50 identifies the DRAM segments, bit blocks and memory cells 62 to be accessed.

The DRAM control logic 40 (FIG. 2) interprets the signals from the microprocessor 26 and produces segment control signals to carry out the read and write operations on the DRAM memory cells 62, as well as other segment control signals to carry out internal array operations, such as precharge and refresh operations. In addition certain segment control signals, including a latch control signal, a precharge/data-output control signal, a read or write control signal and a refresh control signal are generated for each segment 36, each occurring at different times during one system clock cycle of the microprocessor 26 (FIG. 1).

Since each DRAM operation requires a potentially variable minimum time period for satisfactory completion of each operation, because of variables of process, temperature and voltage, a timing delay circuit 84 produces the segment control signals with an integral, variable delay for each segment 36. The clock delay circuit 84 is located in the segment control logic 85 of each segment 36. The clock delay circuit 84 is shown in greater detail in FIG. 4.

The clock delay circuit 84 comprises a reset circuit 86, a delay oscillator 88, a counter 90, and a decoder 92. In general, the clock delay circuit 84 receives a first delayed system clock pulse or signal at 94 created by the DRAM control logic 40 which is a delayed version of a system clock pulse created by the microprocessor 26 (FIG. 1) and supplied on the control bus 56 (FIG. 2) to the DRAM control logic 40. The first delayed system clock pulse signal 94 is delivered to the clock delay circuit 84 (FIG. 4) and to create a set signal at 122 which sets the reset circuit 86. The first delayed system clock signal 94 also creates a first timing control signal 123 through an inverter 121. The relationship of the timing control signals created by the clock delay circuit 84 is established by the set signal 122 relative to the first delayed system clock pulse 94. A second delayed system clock signal 94', which is a delayed version of the first delayed system clock signal 94, is created by the DRAM control logic 84 and is applied to the reset circuit 86.

Setting the reset circuit 86 initiates the operation of the oscillator 88 in relation to the first delayed system clock pulse 94 by delivering a logic high signal at 96 to the oscillator 88. The reset circuit 86 stops the oscillation of the oscillator 88 when the signal to the oscillator 88 at 96 goes to a logic low level. A system reset signal at 98 is generated by the system microprocessor 26 (FIG. 1) to establish a predetermined state of the reset circuit 86 at the beginning of the operation.

In operation, the oscillator 88 creates consecutive oscillator pulses at 100 which are conducted to the counter 90. The counter 90 counts the number of oscillator pulses received and continuously supplies signals at 102 representative of the number of pulses 100 counted. The signals 102 are applied to the decoder 92 which decodes the count signals 102 and produces three additional and separate timing control signals at 200, 202 and 204. The counter 90 establishes the relative timing relationships between the timing control signals 123, 200, 202 and 204, by counting the oscillator pulses in relation to the first delayed system clock pulse 94. The relative timing of the timing control signals 123, 200, 202 and 204 accommodate operating variables associated with the DRAM segment caused by process, temperature and operating voltage. The timing control signals 123, 200, 202 and 204 are delivered to various DRAM logic elements, not shown in FIG. 4, to produce the various segment control signals such as the precharge control signal, the read and write control signals and the refresh control signal.

Figure 5:
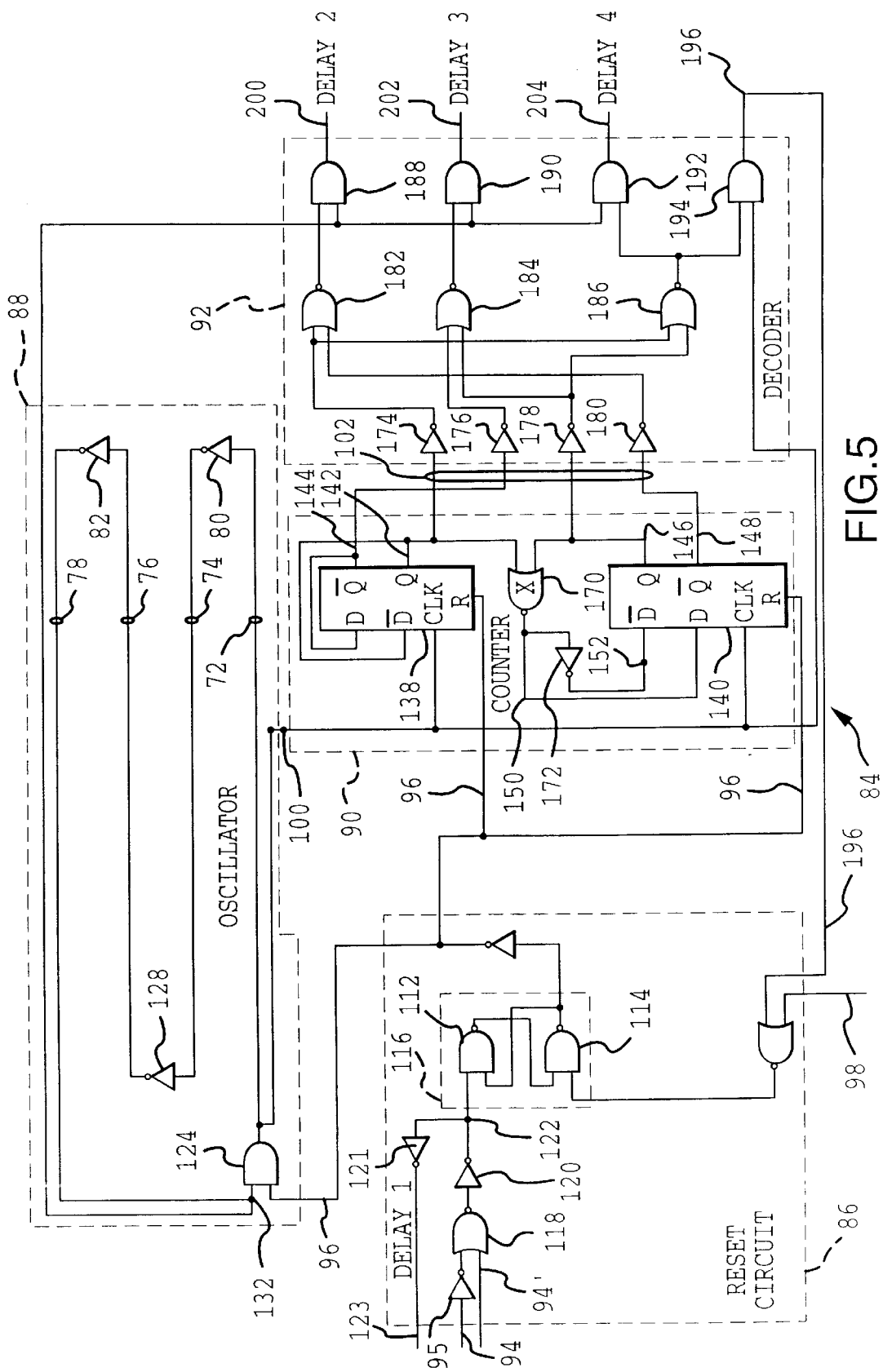
FIG. 5 is schematic drawing of the clock delay circuit shown in FIG. 4.

Details of the timing control circuit 84 are shown in FIG. 5. The reset circuit 86 comprises a pair of cross-coupled NAND gates 112 and 114 creating a "set/reset" flip flop 116. The signal 94 is inverted by an inverter 95 and applied to the set/reset flip flop 116 through a NOR gate 118 and an inverter 120 creating the set signal 122. The set signal 122 sets the flip flop 116 and creates the first timing control signal 123. The application to the NOR gate 118 of the delayed version 94' of the system clock signal 94 stretches the time duration of the high logic level portion of the set signal 122. Once the flip flop 116 has been set, the reset circuit 86 delivers a high logic level output signal 96. The system reset signal 98 establishes an initial predetermined state of the flip flop 116 so that the subsequent operation will be with respect to a known previous state.

The oscillator 88 generally comprises a two-input AND gate 124 and a plurality of inverters 80, 128, and 82. One of the input signals to the AND gate 124 is the signal at 96 conducted from the reset circuit 86. The other input signal at 132 is supplied from the inverter 82. The first inverter 80 is connected to the output terminal of the AND gate 124 by the spare word line 72 (FIG. 3). The second inverter 128, which is located in the DRAM segment control logic 85 (FIG. 3), serially connects the spare word line 74 and the spare bit line 76, and the inverter 82 serially connects the spare bit line 76 and the spare bit line 78. The spare bit line 78 connects the inverter 82 to the input terminal of the AND gate 124.

The odd number of inverters 80, 82 and 128, plus the time delay for signal propagation through the spare bit conductors 72, 74, 76 and 78 causes a feedback signal at 132 to reach a low level state at a predetermined time after the high level signal 96 from the reset circuit 86 is supplied. The resulting low level signal from the AND gate 124 propagates through the conductors 72, 74, 76 and 78 and the inverters 80, 82 and 128 resulting in a high level of the feedback signal 132 at the input terminal to the AND gate 124. This sequence repeats causing oscillation. The output signal 100 from the oscillator 88 is therefore a series of square wave pulses which occur while the reset circuit output signal 96 remains high. The width or time duration of each pulse of the oscillator output signal 100 is determined by the signal propagation time through the spare word and bit lines 72, 74, 76 and 78 and through the inverters 80, 128 and 82. When the reset circuit output signal 96 returns to a low level, the generation of the oscillator pulses 100 ceases.

The oscillator pulses 100 conducted from the AND gate 124 are applied to the counter 90. The counter 90 comprises two D flip flops 138 and 140. The flip flops 138 and 140 receive the reset circuit output signal at 96, and in response, the output terminals 142 and 146 supply a low logic level signal and the terminals 144 and 148 supply a high logic level signal, regardless of any other received signal. The oscillator pulse signal 100 is applied to the clock input terminals of the flip flops 138 and 140. Following receipt of a pulse from the oscillator signal 100, the signal or the output terminals 142 and 146 changes to the same logic value of the signals on the D input terminals of the flip flops 138 and 140 at the time of the oscillator signal 100. Of course, if the logic value on the D input terminals of the flip flops 138 and 140 is the same as the signals at the Q output terminals 142 and 146 during the oscillator pulse 100, then the output signal at 142 or 146 does not change. Similarly, the signals on the not Q output terminals 144 and 148 of the flip flops 138 and 140 change, following an oscillator clock pulse 100, to the logic values of the signals on the not D input terminals of the flip flops 138 and 140, respectively.

The Q output terminal 142 of the flip flop 138 is connected to the not D input terminal of the flip flop 138. The not Q output terminal 144 of the flip flop 138 is connected to the D input terminal of the flip flop 138. In this cross coupled feedback arrangement, each oscillator clock pulse 100 received at the clock terminal of the flip flop 138 causes the signal at the D input terminal to become the signal at the not D input terminal, and vice versa. Therefore, after each clock pulse 100 the signals at 142 and 144 change to the value of the other signal 144 and 142, respectively. The flip flop 138 essentially changes states each time the oscillator 88 produces another pulse 100.

The flip flop 140 also receives the oscillator clock pulses 100 at its clock terminal, but the flip flop 140 does not change states with every clock pulse 100. Instead the flip flop 140 changes states every other clock pulse at 100. In order to make the flip flop 140 change states with every other clock pulse 100, the counter 90 employs an exclusive-OR gate 170. The signals at 142 and 146 which are conducted to the input terminals of the exclusive-OR gate 170 produce an output signal at 150. The signal 150 becomes the D input signal for the flip flop 140. The exclusive-OR gate 170 also conducts the signal 150 to an inverter 172 which, in turn, conducts an inverted version 152 of signal 150 to the not D input terminal of the flip flop 140. Consequently, the output signals from the flip flop 140 depend on the previous output conditions of both flip flops 138 and 140, causing the output signal 146 and 148 to change states every other clock pulse 100 received from the oscillator 88.

In order to understand the overall operation of the counter 90, initially assume an initial condition caused by a reset circuit output signal at 96. Following the signal at 96 the flip flops 138 and 140 each produce an initial output logic state of 0 at terminals 144 and 148 and an initial output logic state of 1 at terminals 142 and 146. The output signals 142 and 146 are conducted to the exclusive-OR gate 170. Since the output conditions of the flip flops 138 and 140 are the same, i.e., both signals 142 and 146 are a logic 0, the exclusive-OR gate 170 produces a low logic signal at 150, which is applied to the D input of the flip flop 140. A high logic signal is produced at 152 by the inverter 172 and applied to the not D input terminal of the flip 140.

Following the first oscillator pulse 100 after the reset circuit output signal 96, the signals at the output terminals 142 and 144 change states. However, the output terminals 146 and 148 do not change states because the logic values on the input terminals 150 and 152 are the same as those located on the output terminals 146 and 148. Since the output signals at the corresponding Q and not Q output terminals of the two flip flops 138 and 140 are different, the exclusive-OR gate 170 delivers a logic high signal 150 to the D input terminal of the flip flop 140, and a logic low signal 152 is conducted to the not D input terminal of the flip flop 140 from the inverter 172.

Following the second oscillator pulse 100 after the reset signal 96, the signals at the output terminals 142 and 144 again change states, as well as the output signals from the output terminals 146 and 148 of the flip flop 140. Since the signal states at the corresponding output terminals of the two flip flops 138 and 140 are different, the exclusive-OR gate 170 produces a logic high signal 150 which is conducted to the D input terminal of the flip flop 140, and a logic low signal 152 which is conducted to the not D input terminal of the flip flop 140.

Figure 4:
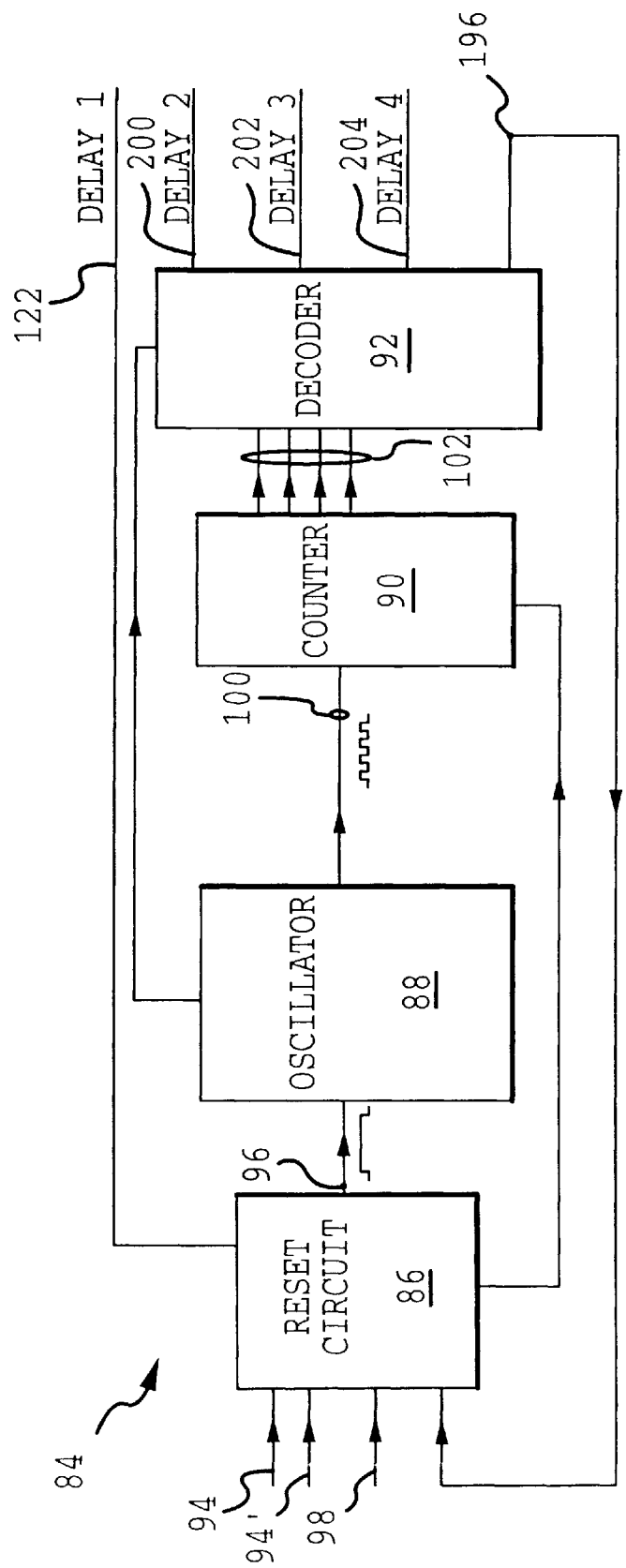
FIG. 4 is block diagram of a clock delay circuit of the DRAM segment shown in FIG. 3, which incorporates the present invention.

Following a third oscillator pulse 100, the output terminals 142 and 144 of the flip flop 138 again change states, but the output signals from the terminals 146 and 148 of the flip flop 140 do not change states since the signal values on the D input terminals at 150 and 152 remain at a high logic level and a low logic level, respectively. Hence, the output terminals 146 and 148 remain at their previous levels, after the third oscillator pulse 100. Once three oscillator pulses 100 have occurred after a reset circuit output signal 96, the combined output terminal signals 142, 144, 146 and 148 of the two flip flops 138 and 140 have cycled through four distinct states, 0101, 1001, 0110, and 1010, in that order. With the next oscillator pulse 100 delivered to the flip flops 138 and 140, the output terminals 142, 144, 146 and 148 will conduct signals representative of initial condition, e.g., 0101. The signals at 142, 144, 146 and 148 represent the count from the counter 90 and are conducted to the decoder 92 at 102 (FIG. 4).

The decoder 92 responds to the count signals at 102 to produce a separate control signal on one of four control terminals 196, 200, 202 and 204 each time the counter 90 is in an initial state and when the state of the counter output signals 102 change. The separate control signals 196, 200,

202 and 204 remain asserted until the next signal 100 is delivered from the oscillator 88 causing the counter 90 to change states.

The decoder 92 comprises four inverters 174, 176, 178 and 180 each of which is selectively connected to receive one of the four output signals 102 from the counter 90. The inverters 174, 176, 178 and 180 receive the signals from the terminals 142, 144, 146 and 148 respectively. The inverters 174, 176, 178 and 180 in turn, selectively conduct signals to three NOR gates 182, 184 and 186. The NOR gate 182 receives signals from the inverters 174 and 176, the NOR gate 184 receives signals from the inverters 178 and 180, and the NOR gate 186 receives signals from the inverters 174 and 180. The three NOR gates 182, 184, and 186 selectively conduct output signals to four, two-input AND gates 188, 190, 192 and 194.

The AND gate 188 receives the signal from the NOR gate 182 as one input, the AND gate 190 receives the signal from the NOR gate 184 as one input. The AND gates 192 and 194 both receive the signal from the NOR gate 186 as one of their respective inputs. The other input signal to the three AND gates 188, 190 and 192 comes from the feedback signal 132 of the oscillator 88. The AND gate 194 receives the signal 100 from the oscillator 88 as its other input. The signal 196 conducted from the output of the AND gate 194 is applied to the reset circuit 86 to reset the flip flop 116 after a series of four delay control signals 123, 200, 202 and 204 are produced.

Following a reset circuit output signal 96, the decoder 92 receives a low logic signal from the terminals 142 and 146. These signals represent a count of one from the counter 90. The NOR gates 182, 184 and 186 are not active and conduct logic low signals.

The leading edge of the first oscillator pulse 100 after the reset circuit output signal 96 causes the signals 102 on the output terminals 142, 144, 146 and 148 from the counter 90 to change from 0101 to 1001, respectively. Consequently, the NOR gate 182 produces a high logic value signal. The high logic value signal from the NOR gate 182 enables the AND gate 188 to produce the DELAY 2 timing control signal 200 upon the occurrence of the second feedback pulse signal 132 from the oscillator 88. The feedback signal 132 remains high until the pulse from the AND gate 124 propagates through delay elements of the oscillator 88, and the AND gate 188 produces a logic high value as the second timing control signal 200 during this time.

Following the leading edge of the second oscillator pulse 100 after the reset circuit output signal 96, the signals on the output terminals 142, 144, 146 and 148 change from 1001 to 0110, and the NOR gate 184 produces a high logic output signal. The high logic signal from the NOR gate 184 enables the AND gate 190 to produce the DELAY 3 control signal 202 upon the occurrence of the feedback signal 132. The AND gate 190 continues to produce the logic high signal at 202 as long as the feedback signal 132 remains a logic high value.

Similarly, following the leading edge of the third oscillator pulse 100 after the reset signal 96, the output terminals 142, 144, 146 and 148 from the counter 90 change from 0110 to 1010, and the NOR gate 186 produces a high logic output signal. The AND gate 192 produces a logic high DELAY 4 signal at 204 until the feedback signal 132 propagates through the delay element of the oscillator 88.

The leading edge of the third oscillator pulse 100 after the reset circuit output signal 96 causes logic high signal from the NOR gate 186 to enable the AND gate 194. The AND gate 194 conducts the signal 196 upon the occurrence of the next oscillator pulse 100. Since the oscillator signal 100 is a logic high value following the change of state of the signals 102, the AND gate 194 produces a logic high signal at 196 with the next oscillator signal 100. The signal 196 is conducted back to the reset circuit 86, causing the reset circuit 86 to be reset and wait for the next first delayed system clock signal 94.

Since the spare word and bit lines 72, 74, 76 and 78 and the string of inverters 80, 128, and 82 comprise the delay elements of the oscillator 88, the feedback signal at 132 remains asserted for a period of time which depends on the time it takes for a signal to propagate along the spare word and bit lines 72, 74, 76 and 78. Therefore, the actual signal propagation time associated with the particular DRAM segment 36 (FIG. 2) becomes an integral part of the timing of each DRAM segment control signal 123, 200, 202 and 204. Each subsequent oscillator pulse 100 is delayed by an amount of time related to the propagation time through the delay elements as influenced by process, temperature and voltage.

The signals 123, 200, 202 and 204 (FIG. 6) are conducted to various DRAM elements, not shown, to carry out control operations of the DRAM array 34. The first control signal 123 is used to create the latch control signal that effectively stores the control, address and data information from the system bus to temporary registers in the DRAM control logic 40 for use by the DRAM array 34 (FIG. 2). The first control signal 123 is also used to create a precharge control signal 206 and a segment enable control signal 208, shown in FIG. 6.

Figure 6:
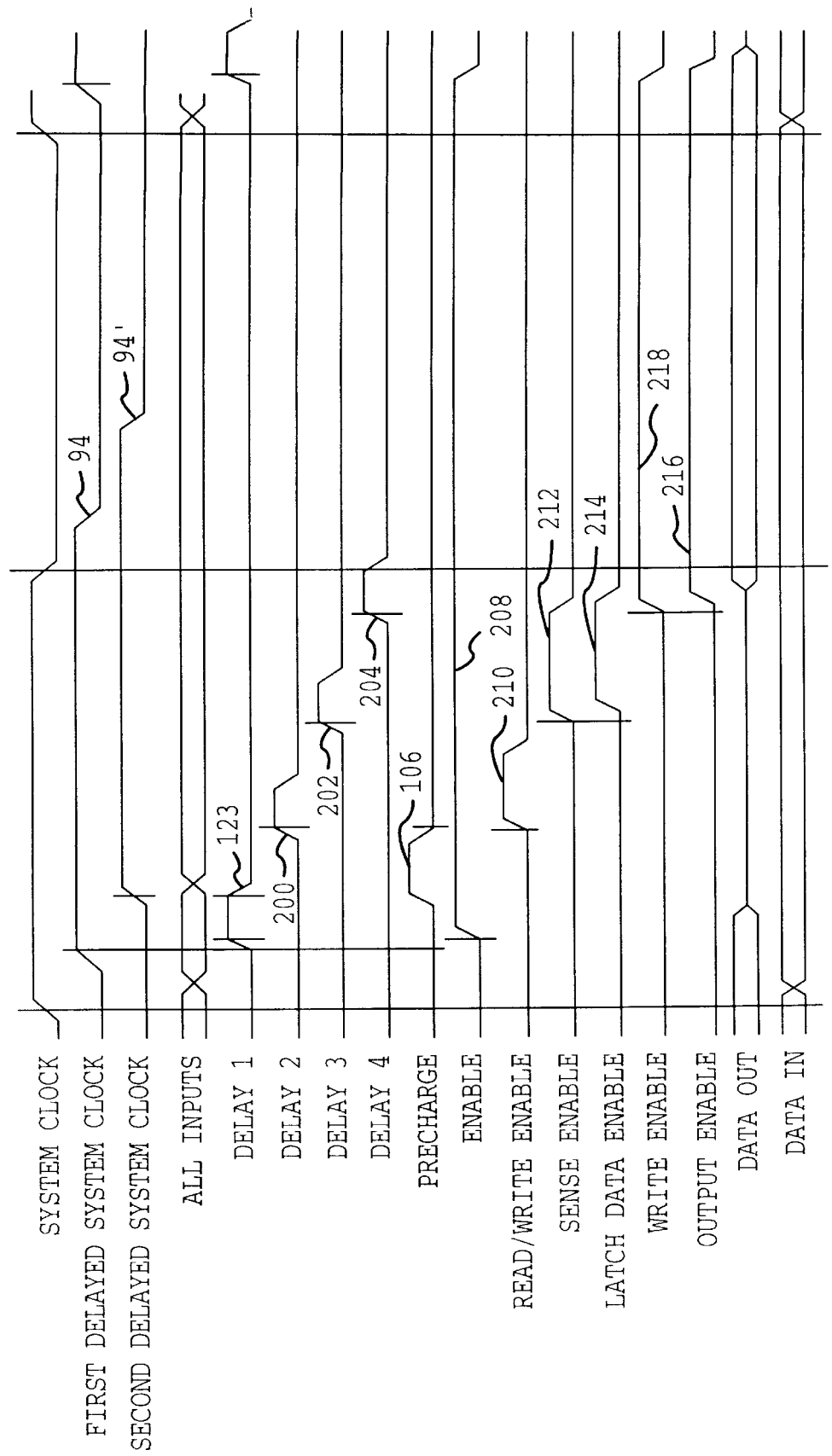
FIG. 6 is a timing diagram illustrating waveform signals created by the clock delay circuit shown in FIG. 5.

The second control signal 200 is used to turn off the precharge control signal 206 and is used to create a read or write control signal 210, as shown in FIG. 6. The third control signal 202 is used to create a sense amp enable control signal 212 to effectively sense voltages on bit lines 66 (FIG. 3) and to create a latch data out control signal 214 which stores the read data in temporary output registers. The fourth control signal 204 is used to create an output enable control signal 216 which informs the microprocessor that data is available on the system bus 38. Additionally, the signal 204 is used to create a write enable control signal 218 to effectively write information to various memory cells 62.

The timing of the signals 200, 202 and 204 depends on the actual signal propagation time of the DRAM segment being used. Usually this time varies with each DRAM segment because the propagation time depends on the thickness of the word and bit lines 64 and 66. Although the manufacturing process causes different sizes of word and bit lines for each segment, the sizes for the word and bit lines 64 and 66 are fairly uniform for each DRAM segment 36. Therefore, the signal propagation time along the spare word and bit line conductors 72, 74, 76, and 78 emulates the actual signal propagation times associated with the word and bit line conductors 64 and 66 in the DRAM segment 36. Propagating a signal along the spare word and bit line conductors 72, 74, 76, and 78 enables the timing control circuit 84 to produce control signals that compensate for timing variations due to the manufacturing process.

Additionally, any operating variables associated with temperature and voltage are accounted for since the spare word and bit lines are located in the DRAM segment. Any environmental chance, such as temperature or voltage, that affects the signal propagation time associated with the word and bit lines 64 and 66 likewise affects the signal propagation time associated with the spare word and bit lines 72, 74, 76, and 78. Since the control signals are derived from the clock delay circuit 84 which uses the spare word and bit lines 72, 74, 76, and 78 to create the control signals, the environmental variables are accounted for in the resulting control signal pulses.

A presently preferred embodiment of the present invention has been described with a degree of particularity. This description is of a preferred example of implementing the invention, and is not necessarily intended to limit the scope of the invention. The scope of the invention is defined by the following claims.

What is claimed is:

1. A clock delay circuit for a memory and which creates control signals having timing relationships relative to a clock signal which vary in relation to inherent variables arising from manufacturing process, temperature and voltage influences on the memory, comprising:

an oscillator having a feedback delay element which establishes an oscillation frequency and period for an output oscillation signal, the feedback delay element including a spare word line and a spare bit line of the memory, each of which extends across the memory; and a counter and decoder circuit responsive to the output oscillation signal to supply a plurality of control signals having a timing relationship established relative to the clock signal by the period of the oscillation signal.

2. A clock delay circuit as defined in claim 1 wherein the counter and decoder circuit supplies only one of the control signals at a time.

3. A clock delay circuit as defined in claim 2 further comprising a plurality of output conductors and wherein each of the control signals supplied by the counter and decoder circuit is supplied on a separate output conductor, each control signal having a unique timing relationship relative to the clock signal, one of the control signals creates either a read enable signal or a write enable signal while negating a precharge signal, another one of the control signals creates a sense amplifier enable signal and latch data enable signal, yet another one of the control signals negates the sense amplifier enable signal and the latch data enable signal while creating an output enable signal.

4. A clock delay circuit as defined in claim 1 wherein each of the control signals supplied by the counter and decoder circuit comprises a pulse applied to one of the conductors, and wherein the pulse time period of each of the control signals is established by the period of oscillation of the output oscillation signal.

5. A clock delay circuit as defined in claim 4 wherein the pulse width of each of the control signals is one half of the period for the output oscillation signal.

6. A clock delay circuit as defined in claim 5 wherein the plurality of control signals supplied by the counter and decoder circuit are supplied during a period of one clock signal.

7. A clock delay circuit as defined in claim 1 wherein at least one of the spare word line and spare bit line comprises electrical characteristics affecting signal propagation time similar to a signal propagation time along one of an actual word line or actual bit line, respectively.

8. A clock delay circuit as defined in claim 1 wherein the memory includes active and inactive memory cells; and the spare word line and spare bit line are connected to inactive memory cells.

9. A clock delay circuit as defined in claim 8 wherein the active memory cells are arranged in a segment having a predetermined number of active memory cells in rows and a predetermined number of active cells in columns;

the spare word line extends along a row of the segment; and the spare bit line extends along a column of the segment.

10. A clock delay circuit as defined in claim 9 wherein the spare word line and spare bit line are serially connected.

11. A clock delay circuit as defined in claim 10 wherein the spare word line comprises a first spare word line conductor and a second spare word line conductor; the spare bit line comprises a first spare bit line conductor and a second spare bit line conductor; and wherein the feedback element further comprises:

first, second and third buffers; and wherein the first buffer is connected to the first spare word line conductor and the second spare word line conductor is connected in series with the first buffer;

the second buffer is connected to second spare word line conductor and the first spare bit line conductor is connected in series with the second buffer; and the third buffer is connected to the first spare bit line conductor and the second spare bit line conductor is connected in series to the third buffer.

12. A clock delay circuit as defined in claim 11 wherein the second spare word line conductor extends along a row of the segment; the second spare bit line conductor extends along a column of the segment.

13. A clock delay circuit as defined in claim 8 wherein the active memory cells are arranged in a segment having a predetermined number of active memory cells in rows and a predetermined number of active cells in columns;

the inactive memory cells are arranged in the segment having a predetermined number of inactive memory cells in at least one row and a predetermined number of inactive memory cells in at least one column;

the spare word line comprises a pair of spare word line conductors, each spare word line conductor extending along a row of inactive memory cells; and the spare bit line comprises a pair of spare bit line conductors, each spare bit line conductor extending along a column of inactive memory cells.

14. A clock delay circuit as defined in claim 13 wherein the pair of spare word lines and the pair of spare bit lines are serially connected.

15. A clock delay circuit as defined in claim 1 further comprising a reset circuit responsive to the clock signal, wherein the reset circuit delivers an enable signal to the oscillator and wherein the oscillator responds to the oscillator circuit to begin oscillating.

16. A clock delay circuit as defined in claim 15 wherein the counter and decoder circuit supplies a reset control signal to the reset circuit to terminate the delivery of the enable signal in response to the last control signal supplied.

17. A clock delay circuit as defined in claim 1 wherein the oscillator produces a delay signal having similar but delayed characteristics related to the output oscillation signal, the counter and decoder circuit further comprising:

a counter which maintains a count of the number of oscillations of the output oscillation signal and produces a count signal representative of the count; and a decoder responsive to the count signal from the counter and responsive to the delay signal to produce control signals from a logical combinations of the count signal and the delay signal.

18. A clock delay circuit as defined in claim 1 wherein the memory comprises a plurality of segments having segment control logic, the clock delay circuit located in the segment control logic.

19. A clock delay circuit as defined in claim 1 wherein the memory is dynamic random access memory embedded in a system-level integrated circuit.

* * * * *